(12) United States Patent
Graef et al.

(10) Patent No.: US 6,687,661 B1
(45) Date of Patent: Feb. 3, 2004

(54) UTILIZING A TECHNOLOGY-INDEPENDENT SYSTEM DESCRIPTION INCORPORATING A METAL LAYER DEPENDENT ATTRIBUTE

(75) Inventors: Stefan Graef, Milpitas, CA (US); Emery Sugasawara, Pleasanton, CA (US)

(73) Assignee: LSI Logic Corporation, Milpitas, CA (US)

( * ) Notice: Subject to any disclaimer, the term of this patent is extended or adjusted under 35 U.S.C. 154(b) by 857 days.

(21) Appl. No.: 09/085,143

(22) Filed: May 26, 1998

(51) Int. Cl.[7] .............................. G06F 17/50; G06F 9/45
(52) U.S. Cl. ............................. 703/14; 716/1; 716/5; 716/6
(58) Field of Search ................... 395/500.02, 500.06, 395/500.07; 716/1, 5–6; 703/14

(56) References Cited

U.S. PATENT DOCUMENTS

| | | | | |
|---|---|---|---|---|
| 5,568,395 A | * | 10/1996 | Huang | 395/500.05 |
| 5,623,418 A | | 4/1997 | Rostoker et al. | 364/489 |
| 5,761,080 A | * | 6/1998 | DeCamp et al. | 395/500.06 |
| 5,808,330 A | * | 9/1998 | Rostoker et al. | 257/208 |
| 5,831,870 A | * | 11/1998 | Folta et al. | 395/500.06 |
| 5,883,814 A | * | 3/1999 | Luk et al. | 395/500.03 |

* cited by examiner

*Primary Examiner*—Hugh Jones
(74) *Attorney, Agent, or Firm*—Mitchell, Silberberg & Knupp, LLP

(57) ABSTRACT

When designing an electronic circuit to be implemented on an integrated circuit die which includes several metal layers, a technology-independent description of a system is generated, the technology-independent description specifying a signal and a selected metal layer for the signal. Also, an electronic circuit description of a system is synthesized from a technology-independent description of the system. Specifically, a technology-independent description of the system is input, the technology-independent description specifying a signal and a metal layer attribute for the signal. Electronic components are selected from a library based on the technology-independent description and interconnections between the electronic components are specified. A metal layer is then specified for an interconnection corresponding to the signal specified in the technology-independent description based on the metal layer attribute specified in the technology-independent description.

30 Claims, 3 Drawing Sheets

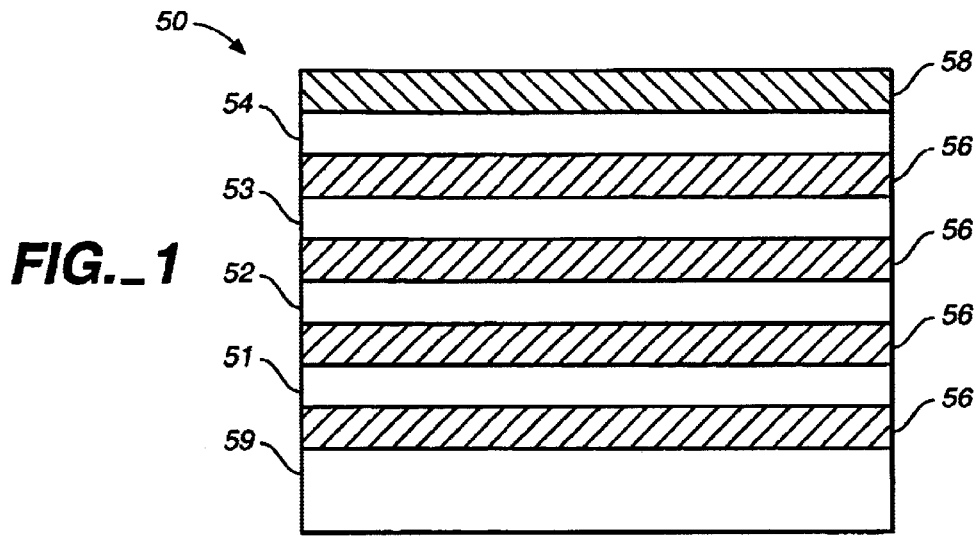
FIG._1
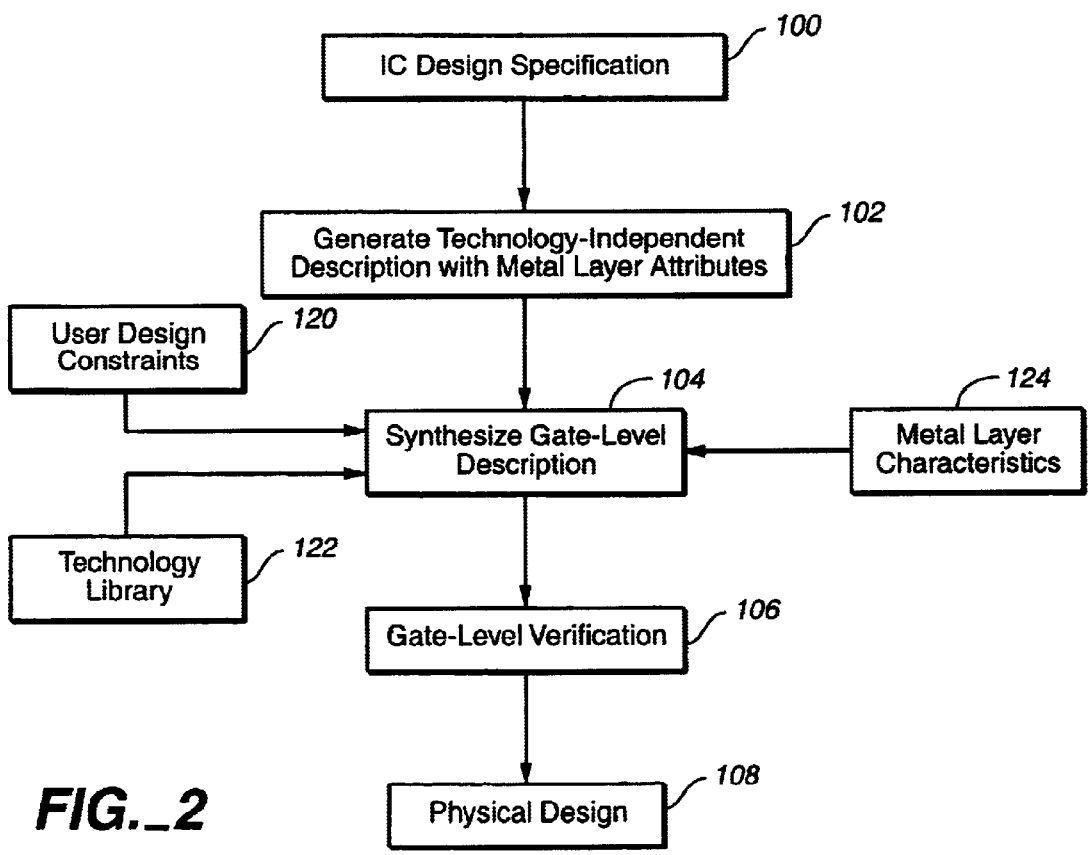
FIG._2

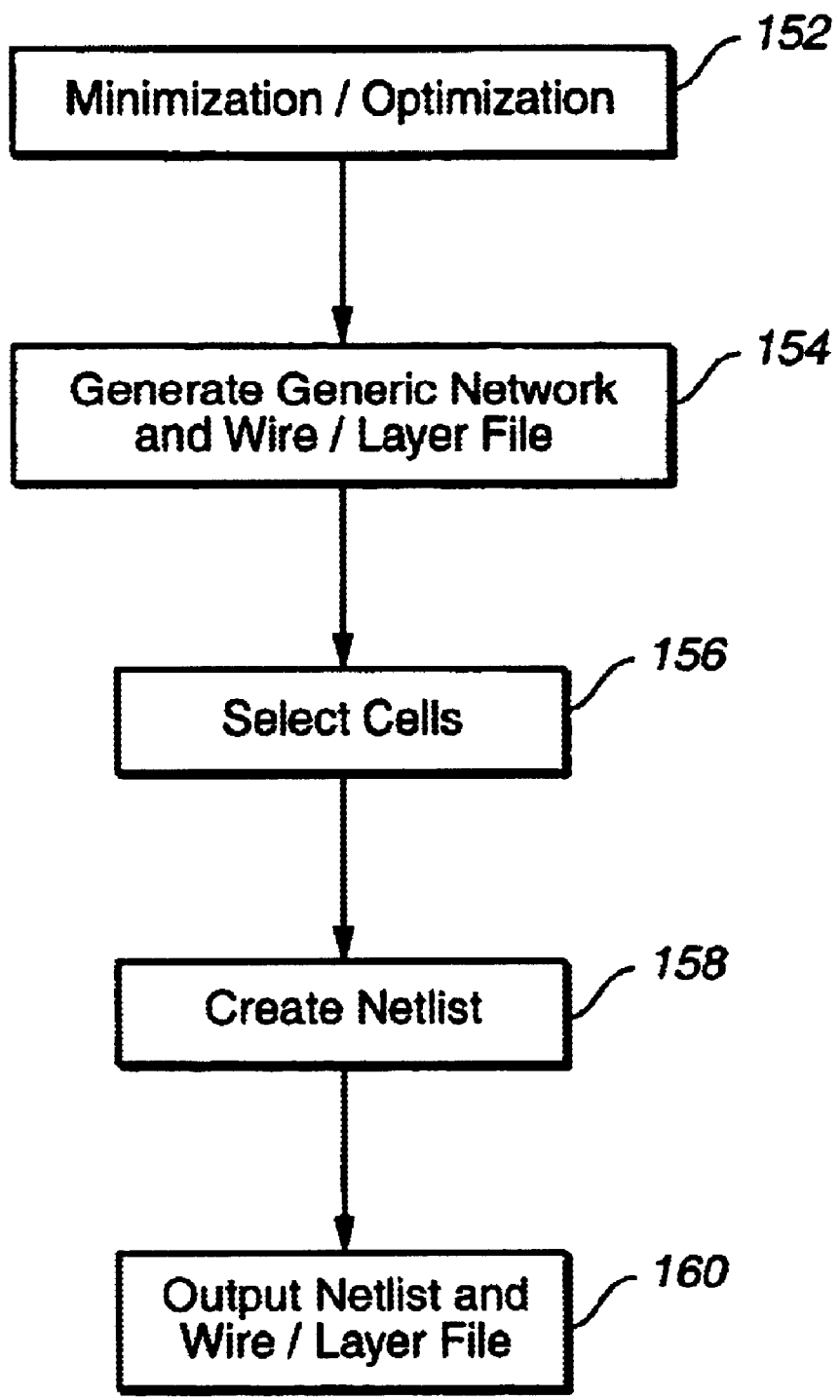
FIG._3

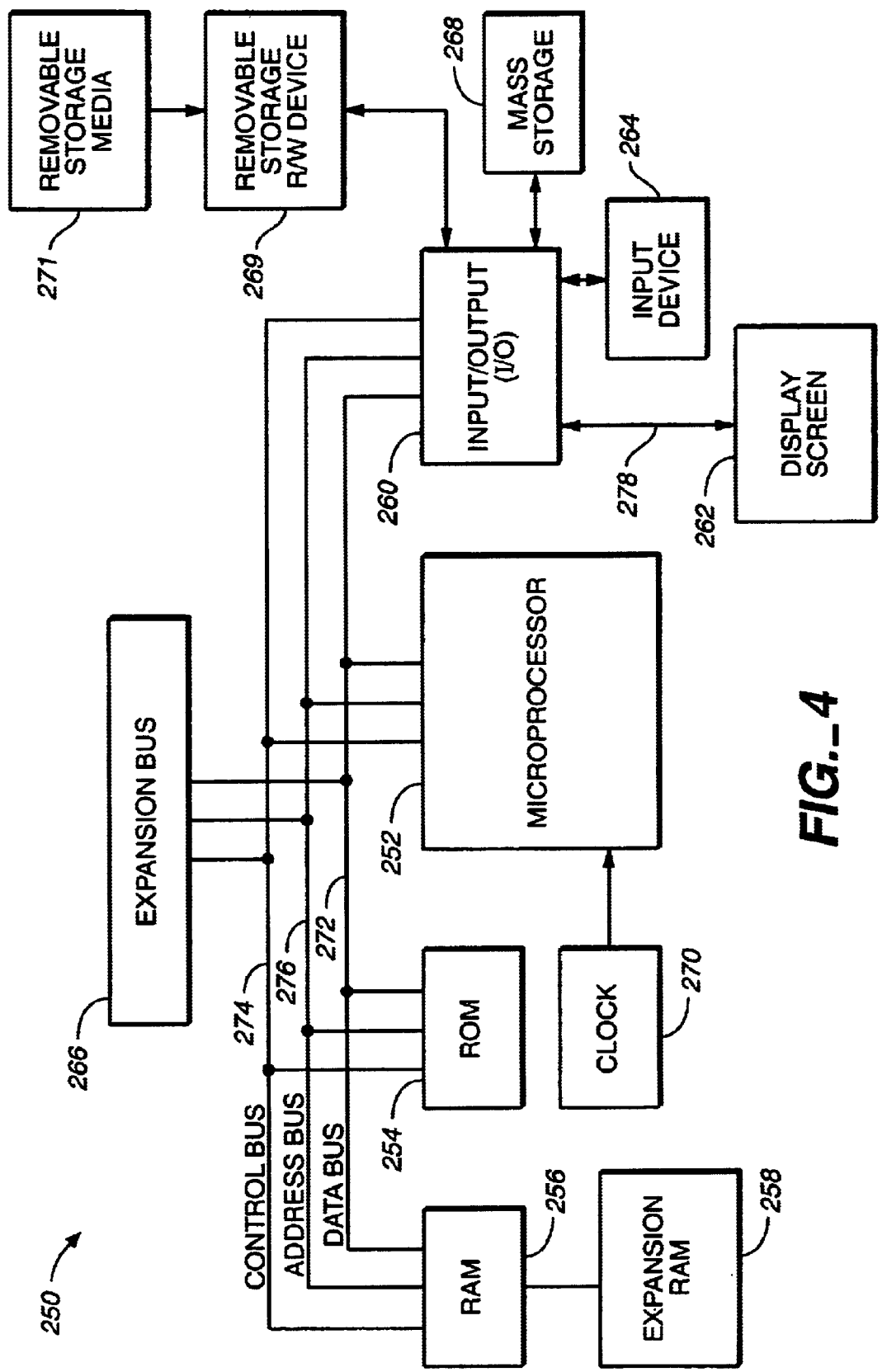
FIG._4

UTILIZING A TECHNOLOGY-INDEPENDENT SYSTEM DESCRIPTION INCORPORATING A METAL LAYER DEPENDENT ATTRIBUTE

BACKGROUND OF THE INVENTION

1. Field of the Invention

The present invention concerns design of integrated circuits (ICs) and particularly relates to use of metal layer dependent attributes in a technology-independent description of an IC design.

2. Description of the Related Art

FIG. 1 provides a simplified cross-sectional view of a typical integrated circuit chip (or die) 50. As shown in FIG. 1, chip 50 includes a semiconductor substrate 59, metal layers 51 to 54, electrically insulating layers 56, and passivation layer 58. Semiconductor substrate 59, which is typically polysilicon, is used for forming the transistors and other electronic devices and may also be used for routing some of the electrical connections between these devices. However, wire routing occupies substrate space which otherwise could be used for the electronic devices. As a result, ordinarily only the shorter electrical connections are formed on substrate 59. For the remainder of the connections, metal layers 51 to 54 are provided.

Metal layers 51 to 54 may be formed from any of a variety of materials including aluminum, copper or an electrically conductive alloy. Typically, two to four metal layers are formed on top of substrate 59. By routing wires in the metal layers 51 to 54, electrical connections can be made without using valuable space on substrate 59. Between metal layers 51 and 52, 52 and 53, and 53 and 54, and between metal layers 51 and substrate 59 is an electrically insulating layer 56, which typically is formed as an oxide film. Connections between any of metal layers 51 to 54 and semiconductor substrate 59 are made using interlayer holes called vias. Passivation layer 58 functions to prevent the deterioration of the electrical properties of the die caused by water, ions and other external contaminants, and typically is made of a scratch-resistant material such as silicon nitride and/or silicon dioxide.

Currently, systems containing hundreds of thousands or millions of interconnected transistors and other basic electronic devices can be implemented on the semiconductor substrate of a single IC chip. Each such electronic device and wire, when viewed in relation to the other components in the IC, must satisfy a variety of electrical and physical requirements. In order to produce such complicated designs in a timely and cost efficient manner, a highly structured multi-phase design cycle has evolved. A conventional design cycle generally includes production of an IC design specification for a desired system, generation of a technology-independent description of the system, synthesis of a gate-level description of a system based on the technology-independent description, gate-level verification and physical design. The IC design specification describes the system at a high level of abstraction. The technology-independent description describes a processing scheme, together with related timing considerations, which will perform according to the design specification. Gate-level synthesis selects specific electronic components from a technology library and specifies wire connections between those components so as to implement the processing set forth in the technology-independent description. Gate-level verification verifies feasibility of the gate-level design. Finally, the physical design phase performs physical cell layout and wire routing and then generates information for fabricating an IC die which implements the gate-level description.

Most commonly, the technology-independent description is written in a hardware description language ("HDL") such as Very High-Speed IC (VHSIC) HDL, or "VHDL". Typically, HDL code provides a well-defined, highly structured syntax for describing a system. Moreover, HDL permits signal processing functionality to be described without specifying the specific hardware required to implement the processing. Many aspects of writing HDL code have been treated in depth in the literature, such as in "VHDL For Designers", S. Sjoholm and L. Lindh, Prentice Hall, 1997; "VHDL And AHDL—Digital System Implementation", F. Scarpino, Prentice Hall 1998; and "VHDL—Analysis and Modeling of Digital Systems", Z. Navabi, McGraw-Hill 1998. These references are incorporated by reference herein as though set forth in full.

VHDL, in particular, allows a designer to describe a system using a functional description (e.g., using a hierarchical arrangement of interconnected functional components), a behavioral description (e.g., using sequential program statements that are similar to those of a high-level programming language), a data-flow description (e.g., using synchronous and asynchronous state machines, data paths, arithmetic operators, and registers), which may include register transfer level (RTL) description, a logic level description (e.g., using Boolean algebra), or by using any combination of these different description types. VHDL provides a syntax which is very similar to that of a software programming language and includes basic design components (or design entities) that have well-defined inputs and outputs. More complicated components can be designed from these basic design components in much the same way that complicated functions are created from basic functions in software design. Once created, these new components can be re-used and employed in hierarchical designs.

Because HDL generally describes a system in terms of generic functionality without specifying particular electronic components, HDL is referred to herein, and frequently in the current literature as well, as being "technology independent". In fact, however, those skilled in the art do not understand the term "technology-independent" in its most strictly literal sense. The mere fact that the HDL description is designed with a view toward implementation on an IC, rather than in some other technology (such as optical computing), often will influence how the description is structured. Moreover, in certain cases a particular HDL description can be tailored to some extent for a given family of technology. Therefore, as used herein, the term "technology-independent" is intended to mean that the description is not primarily linked to a particular hardware implementation. Accordingly, when creating a technology-independent description, the designer generally can ignore factors such as driving strength, component choice, fanout and, often, the more detailed timing considerations.

During the synthesis phase of the IC design cycle, the HDL code is mapped to actual electronic components selected from an available technology library, together with interconnections between those components. Typically, synthesis is performed using an automated software tool such as Design Compiler, produced by Synopsis, Inc. Therefore, synthesis of HDL code in IC design is often likened to compilation of source code in software development.

Gate-level synthesis is thus the first step of IC design in which actual physical components are specified. In order to maintain a feasible design, the actual physical properties of these components generally must be considered. For instance, gate-level synthesis typically considers factors such as gate delay, power consumption and driving strength. In addition, the physical properties of wires connecting the various electronic components also should be considered. In fact, as chip design has improved and as gates have become increasingly faster, wire delays have become even more critical than gate delays in IC design. In this regard, it has been estimated that as much as 70 to 80% of the total delay in certain integrated circuits is due to wire delay. However, as indicated above, the precise routing of a wire between any two electronic components ordinarily is not determined until the physical design phase, and therefore typically is not known during gate-level synthesis.

As a result, many conventional synthesis techniques use a generic wire load model and a generic wire area model for estimating wire capacitance and resistance, respectively. Specifically, the conventional generic wire models typically do not distinguish between wires routed on different metal layers, but rather use a single model which is applied to all metal layers. In fact, however, different metal layers ordinarily will have different distances from the semiconductor substrate, different spacings from adjacent metal layers, and different thicknesses. As a result, electrical properties often will vary according to the metal layer used. Because a generic wire model is employed in the conventional techniques, these estimates frequently lack sufficient accuracy. Such conventional techniques often require either unnecessary error margins, which can increase the size or decrease the speed of the design or, alternatively, can result in additional errors which are discovered only later in the design cycle. In particular, subsequently discovered design problems often require repeating earlier steps to correct the problem, thus increasing the overall cost and time required to design the IC.

Based on the foregoing observation, applicants have filed co-pending U.S. patent application No. 09/007,242, titled "Improved Method Of Selecting And Synthesizing Metal Interconnect Wires In Integrated Circuits", which application is incorporated herein by reference as though set forth herein in full. In application number 09/007,242, applicants have proposed assigning metal layers to signals in the gate-level synthesis phase of IC design, so that it can be known during the synthesis phase which metal layer is to be used for routing a particular signal. Using this knowledge, more accurate estimates of actual wire capacitance and wire resistance often can be obtained.

However, as noted above gate-level synthesis is usually performed automatically using a software tool. Accordingly, assigning metal layer attributes during synthesis typically will not permit the designer to influence the selection of metal layers for particular signals. In addition, it might not always be convenient to assign metal layer attributes during synthesis.

SUMMARY OF THE INVENTION

It is therefore an object of the invention to address the foregoing problem by utilizing a technology-independent description of a system that specifies both a signal and a metal layer attribute for the signal.

According to one aspect, the invention is directed to design of an electronic circuit to be implemented on an integrated circuit die which includes several metal layers, in which a technology-independent description of a system is generated, the technology-independent description specifying a signal and a selected metal layer for the signal.

According to a further aspect, the invention is directed to design of an electronic circuit to be implemented on an integrated circuit die having several metal layers. A hardware description language (HDL) description of a system is generated, the HDL description specifying a signal and a selected metal layer for the signal. An electronic circuit description of the system is then synthesized from the HDL description of the system generated in said generating step, the electronic circuit description of the system specifying electronic components, an interconnection between two of the electronic components, and further specifying that the interconnection between the two electronic components is to be routed on the selected metal layer, the interconnection between the two electronic components corresponding to the signal specified in the generating step.

By virtue of the foregoing arrangement, when creating a technology-independent description of a system a user is capable of designating particular metal layers for routing particular signals. Because the user generally will be aware of the differing properties of the different metal layers, the user often will be able to more accurately tailor the design to the specific requirements of individual signals. For example, the user often knows that a particular signal will require a short delay time; utilizing the foregoing arrangement, the user can designate the metal layer for that signal accordingly. Moreover, in certain cases it may be more convenient for the designer to specify metal layer attributes during design of the technology-independent description of the system, when signal requirements are a significant concern.

In a still further aspect, the invention is directed to synthesizing an electronic circuit description of a system from a technology-independent description of the system. A technology-independent description of the system is input, the technology-independent description specifying a signal and a metal layer attribute for the signal. Electronic components are selected from a library based on the technology-independent description and interconnections between the electronic components are specified. A metal layer is then specified for an interconnection corresponding to the signal specified in the technology-independent description based on the metal layer attribute specified in the technology-independent description.

By virtue of the foregoing arrangement, synthesis of the electronic circuit description can be carried out in consideration of which metal layer is being utilized for a certain electrical connection. As a result, calculations made during such synthesis often can be performed more accurately. For instance, wire capacitance and wire resistance often vary from one metal layer to the next. Utilizing layer-specific characteristics, together with a designation indicating on which metal layer a certain electrical connection is to be made, more accurate estimations of the connection's delay and electrical resistance often can be obtained. Consequently, tighter error margins often can be utilized, resulting in more efficient overall designs. Moreover, because a metal layer attribute for the signal is included in the technology-independent description, assigning metal layer attributes during synthesis often can be avoided.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 illustrates a simplified cross-sectional view of an integrated circuit die which includes four metal layers.

FIG. 2 is flow diagram for illustrating integrated circuit design according to a representative embodiment of the invention.

FIG. 3 is a flow diagram for explaining gate level-synthesis according to a representative embodiment of the invention.

FIG. 4 is a block diagram of a general-purpose computer system, representing one suitable computer platform for implementing the methods of the invention.

DETAILED DESCRIPTION OF THE PREFERRED EMBODIMENTS

The Design Cycle

FIG. 2 illustrates a flow diagram for providing a brief overview of IC chip design according to a representative embodiment of the invention. Briefly, according to FIG. 2, an IC design specification is prepared; a technology-independent description of a system corresponding to the design specification is generated, in which the technology-independent description includes metal layer attributes; a gate-level circuit description is synthesized from the technology-independent description, in which the gate-level circuit description designates metal layers for particular wires between electronic components; a simulation is performed to verify the feasibility of the gate-level circuit description; and physical design is performed.

In more detail, in step 100 an IC system design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a technology-independent description is produced. The technology-independent description describes a system that will satisfy the IC design specification prepared in step 100. Preferably, the technology-independent description of the system is written using a highly structured syntax so as to permit subsequent steps in the design cycle to be performed using automated computer-aided design (CAD) tools. More preferably, the technology-independent description is written in a hardware description language (HDL) such as VHDL (IEEE standard 1076–1993) or Verilog-HDL. Ordinarily, the HDL code will be written manually. However, it also is possible to take advantage of code development tools and pre-existing code libraries.

Unlike conventional IC design, the technology-independent description generated in step 102 both defines a signal and also assigns a metal layer attribute for the signal. Preferably, the metal layer attribute indicates a particular metal layer upon which the signal is to be routed. For instance, when defining a signal according to this embodiment of the invention, the following VHDL code may be used:

SIGNAL sig_a :std_logic-vector(20 DOWNTO 0);—
    pragma metal_layer 3
SIGNAL sig_b :std logic-vector(16-1 DOWNTO 0);—
    pragma metal layer 3

In the above statements, the signals sig_a and sig_b are both provided an attribute named metal_layer, and this attribute is assigned the value 3, signifying the third metal layer. These statements indicate to subsequent gate-level synthesis step 104 that signals sig_a and sig_b are to be routed on metal layer 3.

A specific metal layer is thus designated for a signal in the technology-independent description in this embodiment by providing a metal layer attribute to the signal in VHBL code. In other words, in this embodiment conventional VHDL code is modified so that an attribute specifying a particular metal layer can be provided for one or more signals. However, the foregoing technique for designating a metal layer is not critical; any other method of designating a particular metal layer for a signal may instead be used. For example, an alternative method would be to create a data file listing signals in the technology-independent description and metal layers for those signals.

Moreover, in other embodiments a different metal layer attribute may be designated for a signal. In particular, rather than specifying the actual metal layer to be used, a characteristic of the desired metal layer may instead be designated. In this case, the metal layer number may then be obtained based on the designated characteristic. For instance, a user might designate a desired wire load value for a signal and rely upon a subsequent step, such as synthesis step 104, to select a metal layer for the signal based on the wire load value. In this manner, the user can be freed from remembering the electrical characteristics for each metal layer.

In step 104, a description of a gate-level circuit is synthesized based on the HDL code produced in step 102. Preferably, gate-level circuit design 104 is performed by running an automated synthesis tool on input HDL code. During step 104, physically realizable gates and flip-flops are selected from a pre-defined library 122 and are interconnected in a manner so as to satisfy the relationships and to perform the processing defined by the HDL code. Preferably, step 104 utilizes pre-defined user design constraints 120 which have been formulated in an effort to enhance the feasibility of the design, particularly with respect to problems which might otherwise not be discovered until later in the design cycle. In addition, step 104 inputs metal layer characteristics 124 for each of the metal layers. Metal layer characteristics 124 may include, for example, for each metal layer, resistance per unit length and/or capacitance per unit length for any or all of wire-to-wire, wire-to-ground and wire-to-power parasitic capacitance. Moreover, for each of these parameters, metal layer characteristics 124 may include multiple values including nominal, best case and worst case values.

A simplified representative embodiment of synthesis step 104 will now be discussed with reference to FIG. 3. Briefly, according to FIG. 3, synthesis in step 104 minimizes and optimizes the logic specified in the technology-independent description generated in step 102, so as to obtain an efficient logical representation of the desired system; builds a generic (i.e., still technology-independent) network of logic gates and other circuit elements based on the optimized logical description; maps the generic network into specific actual logic cells; creates a netlist of interconnections between the cells and a file indicating particular metal layers for certain of the interconnections; and then outputs the netlist and signal-to-layer mapping file.

In more detail, in step 152 the logic portion of the technology-independent description is minimized and optimized. First, a minimum number of logical terms that will achieve the function is obtained. Then, redundancies are removed and intermediate levels of logic are added or removed to find a reduced logical expression that will achieve the function.

In step 154, the optimized description is mapped into a generic network by creating intermediate nodes and using technology-independent elements such as simple gates and flip-flops. Connections in the generic network correspond to signals in the technology-independent description. Accordingly, a metal layer attribute for a signal in the technology-independent description is indicated for the corresponding connection in the generic network. Preferably, metal layer attributes are indicated by creating a wire/layer file listing connections and the metal layers upon which the connections are to be made.

In step 156, the generic elements are replaced with actual electronic component cells. Mapping from a network of generic logic gates into actual logic cells involves selecting those cells from the provided technology library 122. For each generic gate, technology library 122 ordinarily includes multiple cells, each having different characteristics. Specific cells are therefore selected from library 122 based on the cell characteristics, the timing considerations set forth in the technology-independent description generated in step 102, the user design constraints 120, and wire characteristics. In this latter regard, synthesis step 104 estimates wire delay times and resistances based on the metal layer attribute for the corresponding signal provided in step 102, in view of the metal layer characteristics 124 for that layer, and also based on an estimate of the wire length. It is noted that an estimate of wire length generally is still required because wire routing has not yet been performed.

A simple example in which two different NAND gates are present in library 122 will illustrate the foregoing selection process. In this example, one of the NAND gate cells requires more die space but has a shorter delay than the other. The wire delay is calculated for a particular path, first assuming that one of the NAND gate cells is used and then assuming the other is used. That is, for each wire in the path, wire delay is calculated for the wire based on the metal layer attribute specified for the wire, the characteristics of the corresponding metal layer, the drive strength of the gate used, and the estimated length of the wire. Frequently, different wire length estimates are used depending on the particular NAND gate cell used, and in particular, depending on the drive strength of the NAND gate. If no metal layer attribute is specified for a particular wire, then the generic wire load and wire area models are instead used for that wire. Next, it is determined whether the combined gate delay and wire delay for the path exceeds one of the timing constraints specified in the technology-independent description and/or in the user design constraints 120 by using the smaller NAND gate or by using the larger gate NAND gate cell. If a constraint is violated by using the smaller NAND gate but not the larger, then the larger NAND gate cell will be selected. On the other hand, if both NAND gate cells satisfy all the timing constraints, then the smaller cell will be selected, all other considerations being equal.

In the foregoing example, physical size and gate delay are considered. Other factors to be considered during step 156 include driving strength, power consumption and input load. In general, a gate having higher driving power, in addition to providing increased fanout, can also result in reduced wire delay.

In step 158, a netlist is created. The netlist categorizes a number of nets, each including one or more gates and/or flip-flops, and also describes the interconnections between these nets. Specifically, the netlist is generated by mapping nodes in the generic network to pins on the actual cells used.

Finally, in step 160, the netlist and wire/layer file are output.

Because synthesis step 104 estimates wire delay and wire resistance based on characteristics for the particular metal layer on which the wire is to be routed, rather than on models which are generic for all metal layers, more accurate estimations often can be obtained. As a result, fewer errors are likely to occur later in the design process, resulting in fewer iterations and correspondingly faster turnaround times. Moreover, because metal layer attributes are assigned during generation of the technology-independent description, the user has the ability to influence which signals are routed on which metal layers.

It should be noted that while a general overview of one implementation of synthesis step 104 has been discussed above, many variations for performing step 104 are possible, as will be readily understood by those skilled in the art. In any implementation, however, it is preferable that the gate-level synthesis step input a technology-independent description which includes a metal layer dependent attribute, such as a designation of a particular metal layer, for at least one signal contained in the technology-independent description. It is further preferable that the gate-level synthesis step calculates at least one wire (or interconnection) parameter based on the corresponding metal layer dependent attribute in the technology-independent description.

Returning to FIG. 2, in gate-level verification step 106, a computer simulation is run to test the circuit design synthesized during gate-level design step 104. The goals of this simulation are to determine whether all performance criteria have been met and whether any timing or other circuit errors will occur in response to a variety of different input signals and conditions. Upon completion of gate-level verification in step 106, the netlist is provided to physical design step 108, and a dump of top-level signals in the netlist is provided to the user.

In physical design step 108, the netlist generated in step 106 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 108 is to implement the design using minimum chip area. Other factors considered during physical design include thermal generation, power/ground noise, electromagnetic effects and the number of metal layers available for wire routing. Upon completion of physical design, the design is again tested for feasibility.

Step 108 produces a set of design files in an unambiguous representation known as an intermediate form that describes the layout. The design files are then converted into pattern generator files that are used to produce patterns called masks by an optical or electron beam pattern generator.

It should be noted that while the foregoing design cycle is preferred, variations of the foregoing may also be used, as will be apparent to those skilled in the art. In addition, although the foregoing design process is described above and shown in FIG. 2 as being purely sequential, many times one or more of the steps will need to be repeated. That is, if the design is found to be unfeasible at one step, an earlier step might need to be re-executed to correct the problem. For example, it might occur that in step 104 a gate-level description can not be generated to satisfy the technology-independent description requirements using the available technology library, while at the same time maintaining the user's design constraints. In this case, the technology-independent description may need to be redesigned in step 102 in order to achieve a feasible design. Similarly, in synthesis step 104 wire delay and wire resistance are estimated based upon estimates of wire length, as actual wire length is not known until completion of the physical design.

Accordingly, failure of a design criterion, such as a timing criterion, after completion of physical design step 108 may require re-execution of synthesis step 104 or even step 102. Finally, within a given step testing will very often be performed in order to verify that the design is feasible and meets all required criteria.

Fabrication

Upon completion of design, as described above, the integrated circuit can be fabricated using the masks generated in step 108 (shown in FIG. 3), but otherwise employing conventional fabrication techniques. During fabrication, the masks generated in step 108 are used to pattern a silicon wafer using a sequence of photo lithographic steps. Photolithography is a common technique employed in the manufacture of semiconductor devices. Typically, a semiconductor wafer is coated with a layer (film) of light-sensitive material, such as photo resist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment

Generally, the methods described herein with respect to IC design will be practiced with a general purpose computer, either with a single processor or multiple processors. FIG. 4 is block diagram of a general purpose computer system, representing one of many suitable computer platforms for implementing the methods described above. FIG. 4 shows a general purpose computer system 250 in accordance with the present invention. As shown in FIG. 4, computer system 250 includes a central processing unit (CPU) 252, read-only memory (ROM) 254, random access memory (RAM) 256, expansion RAM 258, input/output (I/O) circuitry 260, display assembly 262, input device 264, and expansion bus 266. Computer system 250 may also optionally include a mass storage unit 268 such as a disk drive unit or nonvolatile memory such as flash memory and a real-time clock 270.

CPU 252 is coupled to ROM 254 by a data bus 272, control bus 274, and address bus 276. ROM 254 contains the basic operating system for the computer system 250. CPU 252 is also connected to RAM 256 by busses 272, 274, and 276. Expansion RAM 258 is optionally coupled to RAM 256 for use by CPU 252. CPU 252 is also coupled to the I/O circuitry 260 by data bus 272, control bus 274, and address bus 276 to permit data transfers with peripheral devices.

I/O circuitry 260 typically includes a number of latches, registers and direct memory access (DMA) controllers. The purpose of I/O circuitry 260 is to provide an interface between CPU 252 and such peripheral devices as display assembly 262, input device 264, and mass storage 268.

Display assembly 262 of computer system 250 is an output device coupled to I/O circuitry 260 by a data bus 278. Display assembly 262 receives data from I/O circuitry 260 via bus 278 and displays that data on a suitable screen.

The screen for display assembly 262 can be a device that uses a cathode-ray tube (CRT), liquid crystal display (LCD), or the like, of the types commercially available from a variety of manufacturers. Input device 264 can be a keyboard, a mouse, a stylus working in cooperation with a position-sensing display, or the like. The aforementioned input devices are available from a variety of vendors and are well known in the art.

Some type of mass storage 268 is generally considered desirable. However, mass storage 268 can be eliminated by providing a sufficient mount of RAM 256 and expansion RAM 258 to store user application programs and data. In that case, RAMs 256 and 258 can optionally be provided with a backup battery to prevent the loss of data even when computer system 250 is turned off. However, it is generally desirable to have some type of long term mass storage 268 such as a commercially available hard disk drive, nonvolatile memory such as flash memory, battery backed RAM, PC-data cards, or the like.

A removable storage read/write device 269 may be coupled to I/O circuitry 260 to read from and to write to a removable storage media 271. Removable storage media 271 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 250 by typing on a keyboard, manipulating a mouse or trackball, or "writing" on a tablet or on position-sensing screen of display assembly 262. CPU 252 then processes the data under control of an operating system and an application program, such as a program to perform steps of the inventive method described above, stored in ROM 254 and/or RAM 256. CPU 252 then typically produces data which is output to the display assembly 262 to produce appropriate images on its screen.

Expansion bus 266 is coupled to data bus 272, control bus 274, and address bus 276. Expansion bus 266 provides extra ports to couple devices such as network interface circuits, modems, display switches, microphones, speakers, etc. to CPU 252. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for designing an electronic circuit to be implemented on an integrated circuit die which includes plural metal layers, the method comprising:
   a generating step of generating a technology-independent description of a system, the technology-independent description specifying a signal and a selected metal layer for the signal.

2. A method according to claim 1, further comprising:
   a synthesis step of synthesizing an electronic circuit description of the system from the technology-independent description of the system generated in said generating step, the electronic circuit description specifying particular electronic components.

3. A method according to claim 2, wherein said synthesis step estimates a signal delay time based on a pre-stored characteristic for the selected metal layer.

4. A method according to claim 3, wherein the electronic circuit description synthesized in said synthesis step is based on the estimated signal delay time.

5. A method according to claim 2, wherein electrical resistance of an interconnection between two electronic components is estimated in said synthesis step based on a characteristic of the selected metal layer.

6. A method according to claim 1, wherein the technology-independent description is provided in a hardware description language.

7. A method for designing an electronic circuit to be implemented on an integrated circuit die having plural metal layers, the method comprising:
   a generating step of generating a hardware description language (HDL) description of a system, the HDL description specifying a signal and a selected metal layer for the signal; and
   a synthesis step of synthesizing an electronic circuit description of the system from the HDL description of the system generated in said generating step, the electronic circuit description of the system specifying plural electronic components, an interconnection between two of the plural electronic components and further specifying that the interconnection between the two electronic components is to be routed on the selected metal layer,
   wherein the interconnection between the two electronic components corresponds to the signal specified in said generating step.

8. A method according to claim 7, wherein the signal is provided with an attribute that specifies the selected metal layer.

9. A method according to claim 7, wherein a property for the interconnection between the two electronic components is estimated in said synthesis step based on a pre-stored characteristic of the selected metal layer.

10. A method according to claim 7, wherein said synthesis step estimates a signal delay time based on a pre-stored characteristic for the selected metal layer.

11. A method according to claim 10, wherein the electronic circuit description synthesized in said synthesis step is based on the estimated signal delay time.

12. A method for synthesizing an electronic circuit description of a system from a technology-independent description of the system, said method comprising:
   an input step of inputting a technology-independent description of the system, the technology-independent description specifying a signal and a metal layer attribute for the signal;
   a selecting step of selecting electronic components from a library based on the technology-independent description;
   an interconnection-specifying step of specifying interconnections between the electronic components; and
   a metal-layer specifying step of specifying a metal layer for an interconnection corresponding to the signal specified in the technology-independent description based on the metal layer attribute specified in the technology-independent description.

13. A method according to claim 12, wherein the technology-independent description is written in a hardware description language.

14. A method according to claim 12, wherein the metal layer attribute specifies a particular metal layer.

15. A method according to claim 12, wherein the metal layer attribute specifies a characteristic of a metal layer.

16. A method according to claim 12, further comprising an output step of outputting a list of the selected electronic components and the specified interconnections between the selected electronic components.

17. A method according to claim 16, wherein said output step further outputs a list specifying a metal layer on which to route each of plural interconnections.

18. A method according to claim 12, further comprising an estimating step of estimating an electrical property for an interconnection corresponding to the specified signal based on a pre-stored characteristic of a metal layer corresponding to a value of the metal layer attribute.

19. A method according to claim 18, wherein at least one of said interconnection-specifying step and said metal-layer specifying step is performed based on the electrical property estimated in said estimating step.

20. A method for synthesizing an electronic circuit description of a system from a hardware description language (HDL) description of the system, said method comprising:

an input step of inputting the HDL description of the system, the HDL description specifying a signal and a metal layer attribute for the signal;

a selecting step of selecting electronic components from a library based on the HDL description;

an interconnection-specifying step of specifying interconnections between the electronic components; and a metal-layer specifying step of specifying a metal layer for an interconnection corresponding to the signal specified in said input step based on the metal layer attribute specified in the HDL description.

21. A method according to claim 20, further comprising an estimating step of estimating an electrical property for an interconnection corresponding to the specified signal based on a pre-stored characteristic of a metal layer corresponding to a value of the metal layer attribute.

22. A method according to claim 21, wherein at least one of said interconnection-specifying step and said metal-layer specifying step is performed based on the electrical property estimated in said estimating step.

23. An apparatus for synthesizing an electronic circuit description of a system from a technology-independent description of the system, said apparatus comprising:

a processor for executing stored program instruction steps; and a memory connected to the processor for storing the program instruction steps, wherein the program instruction steps include: (1) an input step to input a technology-independent description of the system, the technology-independent description specifying a signal and a metal layer attribute for the signal; (2) a selecting step to select electronic components from a library based on the technology-independent description; (3) an interconnection-specifying step to specify interconnections between the electronic components; and (4) a metal-layer specifying step to specify a metal layer for an interconnection corresponding to the signal specified in the technology-independent description based on the metal layer attribute specified in the technology-independent description.

24. An apparatus for synthesizing an electronic circuit description of a system from a hardware description language (HDL) description of the system, said apparatus comprising:

a processor for executing stored program instruction steps; and a memory connected to the processor for storing the program instruction steps, wherein the program instruction steps include: (1) an input step to input the HDL description of the system, the HDL description specifying a signal and a metal layer attribute for the signal; (2) a selecting step to select electronic components from a library based on the HDL description; (3) an interconnection-specifying step to specify interconnections between the electronic components; and (4) a metal-layer specifying step to specify a metal layer for an interconnection corresponding to the signal specified in said input step based on the metal layer attribute specified in the HDL description.

25. An apparatus according to claim 24, wherein the program instruction steps further include an estimating step to estimate an electrical property for an interconnection corresponding to the specified signal based on a pre-stored characteristic of a metal layer corresponding to a value of the metal layer attribute.

26. An apparatus according to claim 25, wherein at least one of the interconnection-specifying step and said metal-layer specifying step is performed based on the electrical property estimated in said estimating step.

27. Computer-executable process steps stored on a computer readable medium, said process steps for synthesizing an electronic circuit description of a system from a technology-independent description of the system, said process steps comprising:

an input step to input a technology-independent description of the system, the technology-independent description specifying a signal and a metal layer attribute for the signal;

a selecting step to select electronic components from a library based on the technology-independent description;

an interconnection-specifying step to specify interconnections between the electronic components; and a metal-layer specifying step to specify a metal layer for an interconnection corresponding to the signal specified in the technology-independent description based on the metal layer attribute specified in the technology-independent description.

28. Computer-executable process steps stored on a computer readable medium, said process steps for synthesizing an electronic circuit description of a system from a hardware description language (HDL) description of the system, said process steps comprising:

an input step to input the HDL description of the system, the HDL description specifying a signal and a metal layer attribute for the signal;

a selecting step to select electronic components from a library based on the HDL description;

an interconnection-specifying step to specify interconnections between the electronic components; and a metal-layer specifying step to specify a metal layer for an interconnection corresponding to the signal specified in said input step based on the metal layer attribute specified in the HDL description.

29. Computer-executable process steps according to claim 28, further comprising an estimating step to estimate an electrical property for an interconnection corresponding to the specified signal based on a pre-stored characteristic of a metal layer corresponding to a value of the metal layer attribute.

30. Computer-executable process steps according to claim 29, wherein at least one of said interconnection-specifying step and said metal-layer specifying step is performed based on the electrical property estimated in said estimating step.

* * * * *